(12) United States Patent
Kwak et al.

(10) Patent No.: US 6,852,559 B2
(45) Date of Patent: Feb. 8, 2005

(54) TRANSISTOR OF SEMICONDUCTOR DEVICE, AND METHOD FOR MANUFACTURING THE SAME

(75) Inventors: Byung Il Kwak, Seoul (KR); Kyung Jun Ahn, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/608,194

(22) Filed: Jun. 30, 2003

(65) Prior Publication Data

US 2004/0108558 A1 Jun. 10, 2004

(30) Foreign Application Priority Data

Dec. 6, 2002 (KR) ................................ 10-2002-0077492

(51) Int. Cl.[7] .............................................. H01L 21/00
(52) U.S. Cl. ......................................... 438/44; 438/222
(58) Field of Search ........................ 438/44, 216, 261, 438/282, 591

(56) References Cited

U.S. PATENT DOCUMENTS 6,605,498 B1 * 8/2003 Murthy et al. .............. 438/197
2002/0142557 A1 * 10/2002 Hashimoto et al. ......... 438/309

OTHER PUBLICATIONS

F. Scott Johnson et al., "Selective Chemical Etching of Polycrystalline SiGe Alloys with Respect to Si and $SiO_2$", Journal of Electronic Materials, 1992, pp. 805–810, vol. 21, No. 8.

* cited by examiner

Primary Examiner—George Fourson
Assistant Examiner—Michelle Estrada
(74) Attorney, Agent, or Firm—Heller Ehrman White and McAuliffe LLP

(57) ABSTRACT

A semiconductor device and a method for forming the same are disclosed. The semiconductor device includes an epitaxial source/drain junction layer having an insulating film thereunder. The method comprises the step of forming a under-cut under an epitaxial source/drain junction layer so that an insulating film filling the under-cut can be formed.

13 Claims, 9 Drawing Sheets

TRANSISTOR OF SEMICONDUCTOR DEVICE, AND METHOD FOR MANUFACTURING THE SAME

BACKGROUND OF THE INVENTION

1. Field of the Invention

The present invention relates to transistor of semiconductor device and method for manufacturing the same, and more particularly to improved transistor of memory device and method for manufacturing the same which provides a high speed and high integrated device by preventing deterioration of the characteristics of the device resulting from increase of impurity concentration as the integration of the device is increased.

2. Description of the Background Art

As the integration of a semiconductor device has been increased, integration of a DRAM has increased. However, the refresh time of the DRAM is almost double in each generation because of a high speed and low power requirements.

As the density of a memory device continuously increases, the concentration of impurities implanted into a substrate must be increased to minimize short channel effects, threshold voltages and leakage currents. However, the increase of the concentration of impurities results in increase of junction electric intensity, which generates short channel effects and leakage currents.

Moreover, the increase of concentration increases junction capacitance, thereby reducing the operation speed of the device.

As described above, in the conventional transistor of the semiconductor device and a method for manufacturing the same, the characteristics of the device is degraded due to the increased concentration of impurities implanted into the substrate, thereby making the achievement of the high operation speed and high integration of the semiconductor device more difficult.

SUMMARY OF THE INVENTION

Accordingly, it is an object of the present invention to provide a transistor of a semiconductor device and a method for forming the same wherein capacitance generated by junction leakage current and junction depletion in a source/drain junction layer is remove to achieve a high speed and high integration of the device.

According to one aspect of the present invention, a transistor of a semiconductor device, comprising: an epitaxial channel region disposed on an active region of a semiconductor substrate; a stacked structure of an insulating film and an epitaxial source/drain junction layer disposed at both sides of the channel region; and a stacked structure of a gate insulating film and a gate electrode disposed on the epitaxial channel region, wherein at least a portion of the gate insulating film overlap with the source/drain junction layer is provided.

According to another aspect of the invention, a method for forming a transistor of a semiconductor device, comprising the steps of: forming a stacked structure of a first epitaxial layer and a second epitaxial layer on a semiconductor substrate; forming a device isolation film of trench type defining an active region, wherein a thickness of the device isolation film is substantially the same as that of the stacked structure; implanting an impurity into the second epitaxial layer using the device isolation film as a mask; sequentially forming a thermal oxide film and a sacrificial film on the entire surface of the resulting structure; etching the sacrificial film, the thermal oxide film, and the second and first epitaxial layers using a gate electrode mask to form an opening exposing the semiconductor substrate; removing the first epitaxial layer to form an under-cut under the second epitaxial layer; forming an insulating film filling the under-cut; growing a third epitaxial layer on the semiconductor substrate exposed by the opening; removing the sacrificial film and the thermal oxide film; implanting an impurity into the third epitaxial layer to form a channel region; and forming a gate electrode on the channel region is provided.

According to yet another aspect of the invention, a method for forming a transistor of a semiconductor device, comprising the steps of: forming a stacked structure of a first epitaxial layer and a second epitaxial layer on a semiconductor substrate; forming a device isolation film of trench type defining an active region; forming a dummy gate electrode on the second epitaxial layer; implanting an impurity into the second epitaxial layer using the dummy gate electrode as a mask; forming an insulating film spacer at a sidewall of the dummy gate; forming a thermal oxide film on the entire surface of the resulting structure; forming a planarized interlayer insulating film exposing the top surface of the dummy gate; etching the dummy gate and the second and first epitaxial layers therebelow to form an opening exposing the semiconductor substrate; removing the first epitaxial layer to form an under-cut under the second epitaxial layer; forming an insulating film filling the under-cut; growing a third epitaxial layer having an impurity implanted therein on the semiconductor substrate exposed by the opening; and forming a stacked structure of a gate oxide film and a gate electrode on the third epitaxial layer is provided.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A transistor of a semiconductor device and a method for forming the same in accordance with preferred embodiments of the present invention will now be described in detail with reference to the accompanying drawings.

Figure 1:
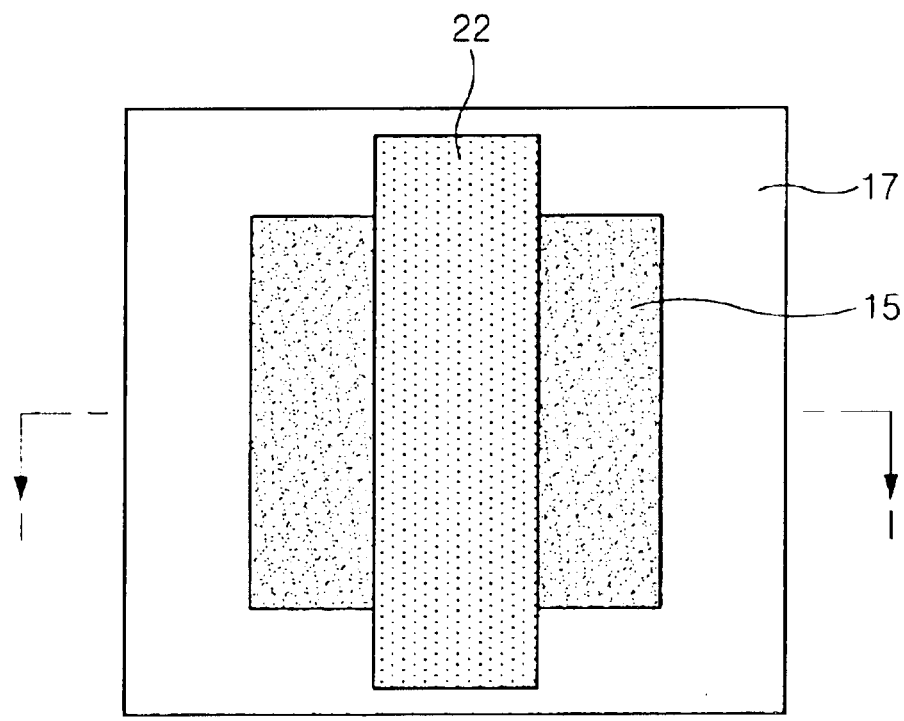
FIG. 1 is a layout diagram illustrating an active region and a gate region formed in one field.

FIG. 1 is a layout diagram illustrating an active region and a gate electrode region 22 formed on a semiconductor substrate 11, and FIGS. 2a to 2f are cross-sectional diagrams illustrating sequential steps of a method for forming a transistor of a semiconductor device in accordance with a first embodiment of the present invention, taken along lines I—I of FIG. 1.

Figure 2A:
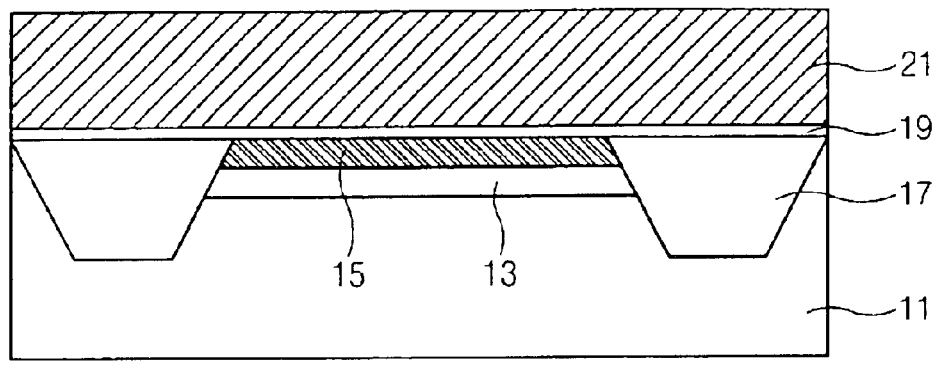
FIGS. 2a to 2f are cross-sectional diagrams illustrating sequential steps of a method for forming a transistor of a semiconductor device in accordance with a first embodiment of the present invention.

Referring to FIG. 2a, an first epitaxial layer 13 and a conductive second epitaxial layer 15 are sequentially formed on the semiconductor substrate 11 consisting of silicon.

Preferably, the first epitaxial layer 13 is an epitaxial SiGe layer formed under an atmosphere of a mixture gas of a gas from the group consisting of $GeH_4$, $SiH_4$, $SiH_2Cl_2$ and combinations thereof, HCl and $H_2$, and has a thickness ranging from 50 to 1000 Å, and the second epitaxial layer 15 is an epitaxial Si layer formed under an atmosphere of a gas from the group consisting of $SiH_4$, $SiH_2Cl_2$ and combinations thereof, HCl and $H_2$, and has a thickness ranging from 50 to 1000 Å.

A pad oxide film (not shown) and a nitride film (not shown) are sequentially formed on the entire surface of the resulting structure.

Thereafter, the nitride film, the oxide film, the second epitaxial layer 15, the first epitaxial layer 13 and a predetermined depth of semiconductor substrate 11 are etched via a photoetching process using a device isolation mask (not shown) to form a trench. A device isolation film 17 is formed by filling the trench to define an active region.

Next, the second epitaxial layer 15 is subjected to an implant process using the device isolation film 17 as a mask. The implant process is preferably performed using As having a concentration ranging from 1.0E12 to 5.0E13 atoms/$cm^2$ with an energy ranging from 10 to 100 KeV. Other conventional impurities may be used.

A thermal oxide film 19 is formed on the entire surface of the resulting structure. The thermal oxide film preferably has a thickness ranging from 10 to 200 Å. A sacrificial film 21 is then formed on the thermal oxide film 19. Preferably, the sacrificial film 21 may be an oxide film, nitride film or polysilicon film having a thickness ranging from 500 to 3000 Å and used as a mask.

Figure 2B:
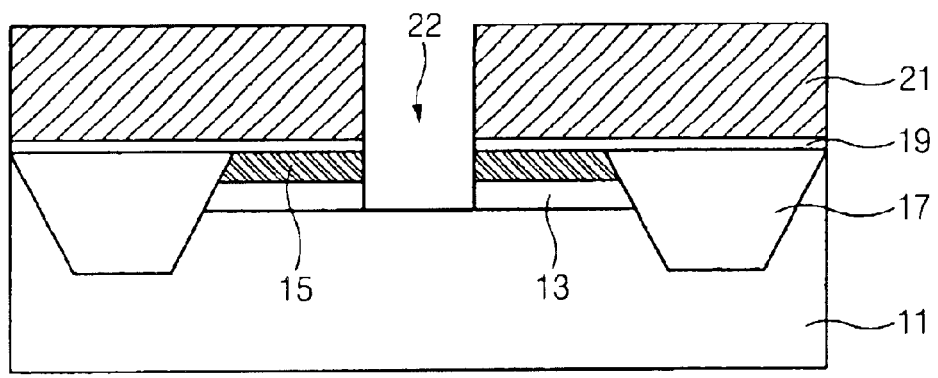

Referring to FIG. 2b, a gate electrode region 22 exposing the semiconductor substrate 11 is formed by sequentially etching the sacrificial film 21, the thermal oxide film 19, the second epitaxial layer 15 and the first epitaxial layer 13 via a photoetching process using a mask exposing an region corresponding to the gate electrode region 22 of FIG. 1.

Figure 2C:
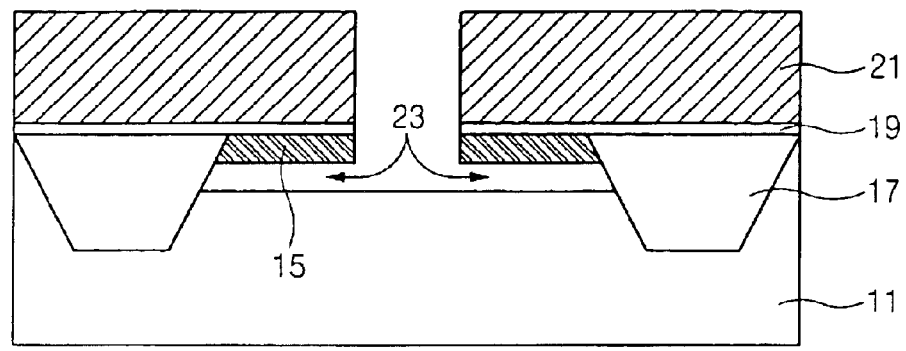

Referring to FIG. 2c, the first epitaxial layer 13 exposed by a lower sidewall of the gate electrode region 22 is removed to form an under-cut 23 under the second epitaxial layer 15. Preferably, the process for removing the exposed portion of the first epitaxial layer 13 is a wet etching process or an isotropic dry etching process utilizing etching selectivity differences among adjacent layers and the first epitaxial layer 13.

Specifically, the wet etching process is preferably performed using a solution containing $H_2O$, $H_2O_2$ and $NH_4OH$ having a ratio of 5:1:1 at a temperature ranging from 70 to 80° C. (ref. F. S. Johnson et al. journal of electronic materials, vol21, p.805–810, 1992). The isotropic dry etching process is preferably a plasma etching process using HBr, $O_2$ and $Cl_2$, and more preferably performed using microwaves to improve isotropic etching properties. In addition, the plasma etching process may be performed using $SF_6$.

Figure 2D:
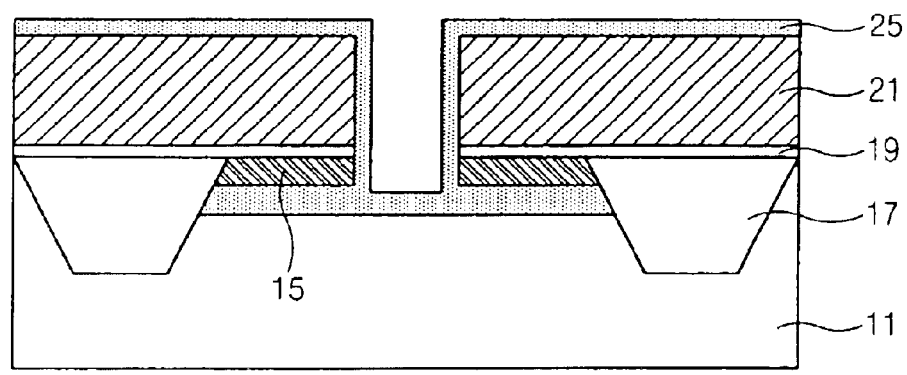

Now referring to FIG. 2d, an insulating film 25 for filling the under-cut 23 is formed on the entire surface of the resulting structure. Preferably, the insulating film 25 is an oxide film or nitride film.

The insulating film 25 is preferably formed via thermal oxidation, chemical vapor deposition (CVD) or atomic layer deposition (ALD).

Preferably, the CVD process is performed using $SiH_4$ and $N_2O$ under a pressure of 50 Torr and at a temperature ranging from 50 to 800° C. The thermal oxidation process is a dry or wet process performed at a temperature of 700 to 1100° C.

Figure 2E:
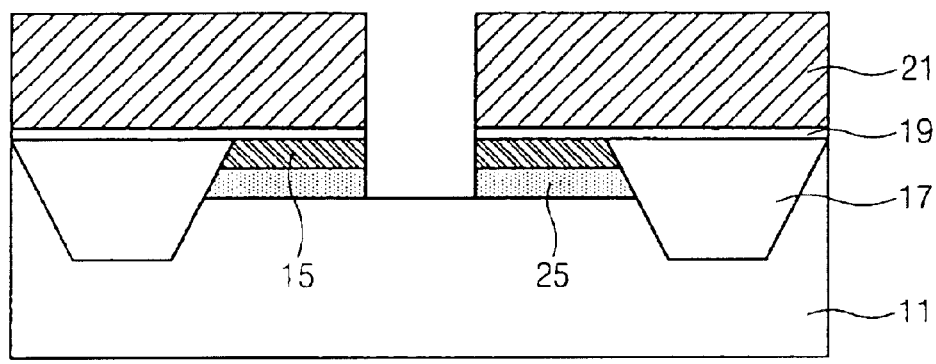

Referring to FIG. 2e, a wet etching process is performed so that only the portion of the insulating film 25 in the under-cut 23 remains. The wet etching process is preferably performed using a HF group etching solution.

Figure 2F:
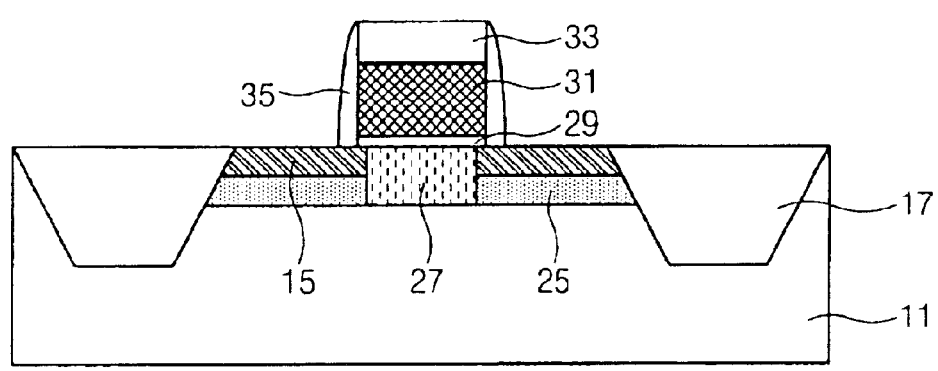

As shown in FIG. 2f, a third epitaxial layer 27 is grown on the semiconductor substrate 11 exposed by the gate electrode region 22.

Preferably, the third epitaxial layer 27 is an epitaxial Si layer having a thickness ranging from 100 to 2000 Å formed under an atmosphere of a mixture gas of a gas from the group consisting of $SiH_4$, $SiH_2Cl_2$ and combinations thereof, HCl and $H_2$.

The sacrificial oxide film 21 and the thermal oxide film 19 are removed via a wet etching process. Preferably, the wet etching process is performed by utilizing the etching selectivity difference among adjacent other layers and the sacrificial oxide film 21.

A channel region is formed on the third epitaxial layer 27 by performing a channel implant process and a punch stop implant process.

A gate electrode having a stacked structure of a gate oxide film 29, a conductive layer for gate electrode 31 and a hard mask layer 33 is formed via a photoetching process using a gate electrode mask. Conventional conductive materials may be used as the conductive layer for gate electrode 31. The hard mask layer 33 is preferably a nitride film or an oxide film.

The formation of the channel region and removal of the sacrificial oxide film 21 and the thermal oxide film 19 may be performed prior to the formation of the gate electrode.

In the transistor of the semiconductor device formed according to the method of FIGS. 2a to 2f, the conductive third epitaxial layer 27 formed in the active region of the semiconductor substrate 11 corresponds to the channel region of the transistor. The stacked structure of the insulating film 25 and the conductive second epitaxial layer 15 is formed at both sides of the third epitaxial layer 27, and the gate insulating film 29 and the gate electrode 31 are formed on the third epitaxial layer 27. The second epitaxial layer 15 corresponds to a source/drain junction layer, and at least a portion of the gate insulating film 29 overlap with the second epitaxial layer 15.

FIGS. 3a to 3i are cross-sectional diagrams illustrating sequential steps of a method for forming a transistor of a semiconductor device in accordance with a second embodiment of the present invention, taken along lines I—I of FIG. 1.

Figure 3A:
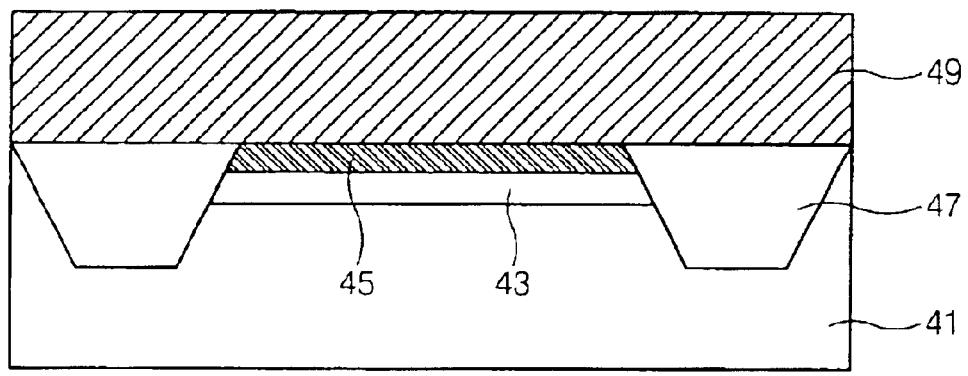
FIGS. 3a to 3i are cross-sectional diagrams illustrating sequential steps of a method for forming a transistor of a semiconductor device in accordance with a second embodiment of the present invention.

Referring to FIG. 3a, an first epitaxial layer 43 and a conductive second epitaxial layer 45 are sequentially formed on the semiconductor substrate 41 comprised of silicon. Preferably, the first epitaxial layer 43 is an epitaxial SiGe layer having a thickness ranging from 50 to 1000 Å formed under an atmosphere of a mixture gas of a gas from the group consisting of $GeH_4$, $SiH_4$, $SiH_2Cl_2$ and combinations thereof, HCl and $H_2$, and the second epitaxial layer 45 is an epitaxial Si layer having a thickness ranging from 50 to 1000 Å formed under an atmosphere of a mixture gas of a gas from the group consisting of $SiH_4$, $SiH_2Cl_2$ and combinations thereof, HCl and $H_2$.

A pad oxide film (not shown) and a nitride film (not shown) are sequentially formed on the entire surface of the resulting structure.

Thereafter, the nitride film, the oxide film, the second epitaxial layer 45, the first epitaxial layer 43 and a predetermined depth of semiconductor substrate 41 are etched via a photoetching process using a device isolation mask (not shown) to form a trench. A device isolation film 47 is formed by filling the trench to define an active region.

Figure 3B:
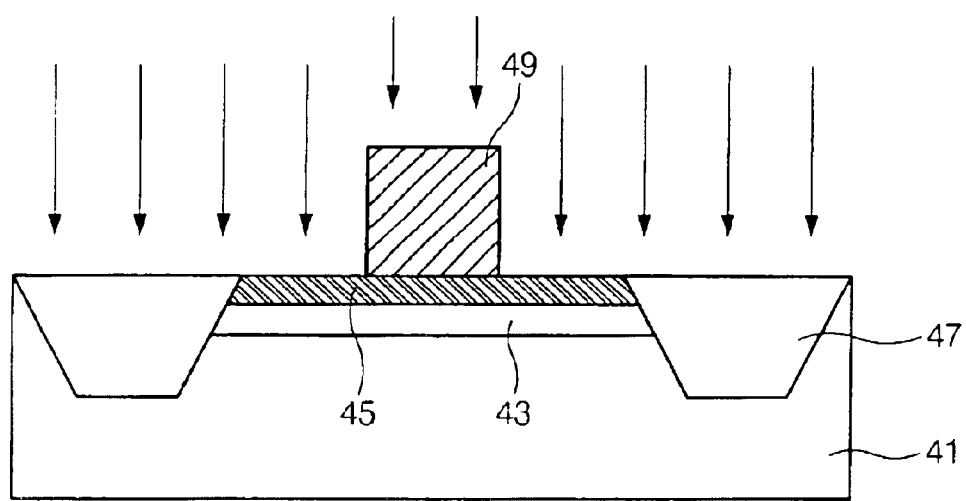

Referring to FIG. 3b, a polysilicon layer (not shown) is formed on the entire surface of the resulting structure, and then etched via a photoetching process using a gate electrode mask to form a dummy gate electrode 49 in a predetermined region where a gate electrode region is to be formed. The thickness of the polysilicon layer is substantially the same as that of the gate electrode formed in a subsequent process, for example, 500 to 3000 Å in thickness. An oxide film or nitride film may be used other than the polysilicon layer.

Thereafter, the second epitaxial layer 45 is subjected to an implant process using the dummy gate electrode 49 as a mask. The implant process is preferably performed using As having a concentration ranging from 1.0E12 to 5.0E13 atoms/cm$^2$ with an energy ranging from 10 to 100 KeV. Other conventional impurities may be used.

The implant process may also be performed prior to the formation of the polysilicon layer using the device isolation film 47 as a mask.

Figure 3C:
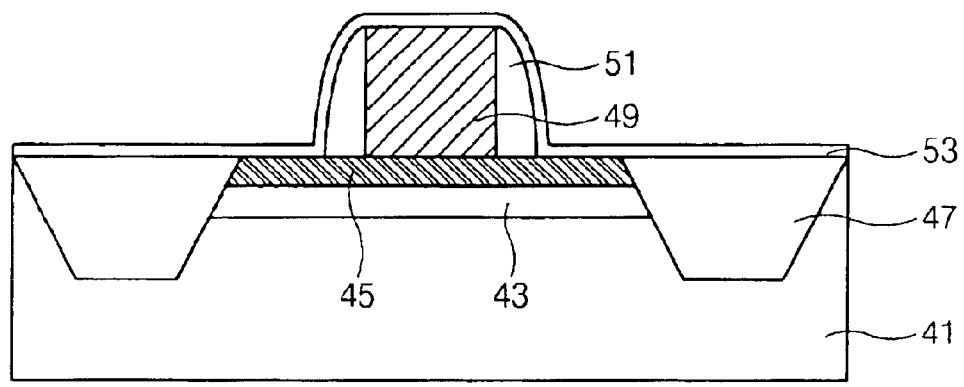

Referring to FIG. 3c, an insulating film spacer 51, preferably a nitride film or an oxide film is formed at sidewalls of the dummy gate electrode 49. A thermal oxide film 53 is then formed on the entire surface of the resulting structure.

Figure 3D:
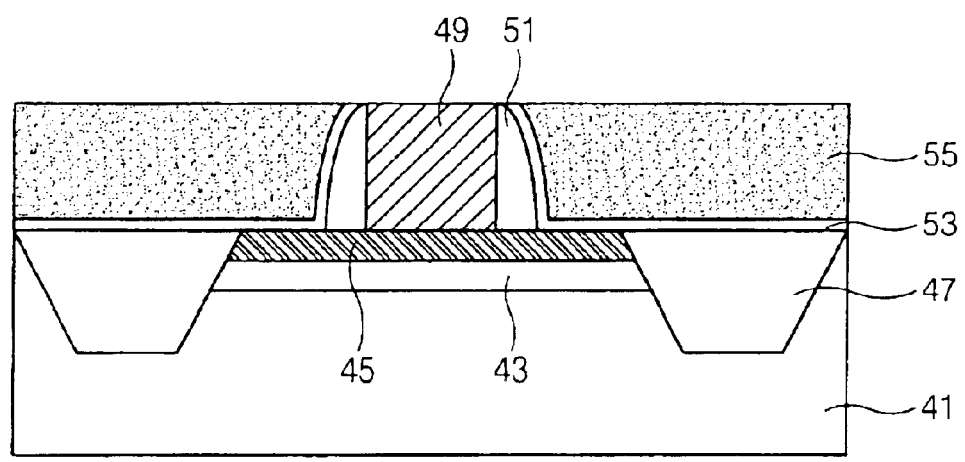

Now referring to FIG. 3d, an interlayer insulating film 55 is formed on the entire surface of the resulting structure, and then planarized to expose the top surface of the dummy gate electrode 49. Preferably, the planarization process is a CMP process.

Figure 3E:
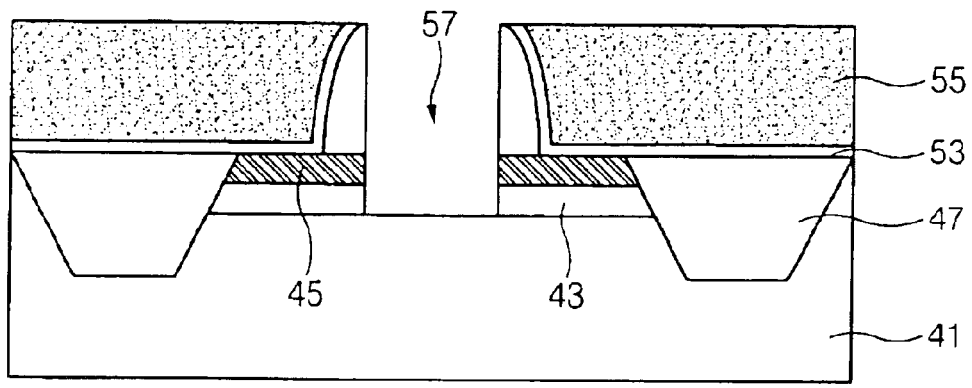

Referring to FIG. 3e, the exposed dummy gate electrode 49 is first removed, and the second epitaxial layer 45 and the first epitaxial layer 43 are etched using the interlayer insulating film 55 and the insulating film spacer 51 as a mask to form a gate electrode region 57 exposing the semiconductor substrate 41.

Figure 3F:
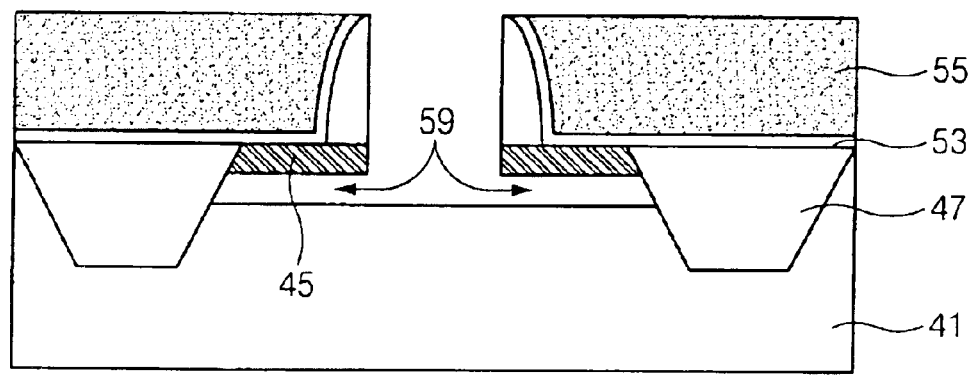

Referring to FIG. 3f, the first epitaxial layer 43 exposed by a lower sidewall of the gate electrode region 57 is removed to form an under-cut 59 under the second epitaxial layer 45. Preferably, the process for removing the exposed portion of the first epitaxial layer 43 is a wet etching process or an isotropic dry etching process utilizing etching selectivity differences among adjacent and the first signal-crystalline layer 43.

Specifically, the wet etching process is preferably performed using a solution containing $H_2O$, $H_2O_2$, $NH_4OH$ having a ratio of 5:1:1 at a temperature ranging from 70 to 80° C. (ref. F. S. Johnson et al. journal of electronic materials, vol 21, p.805–810, 1992). The isotropic dry etching process is preferably a plasma etching process using HBr, $O_2$ and $Cl_2$, and more preferably performed using microwaves to improve isotropic etching properties. In addition, the plasma etching process may be performed using $SF_6$.

Figure 3G:
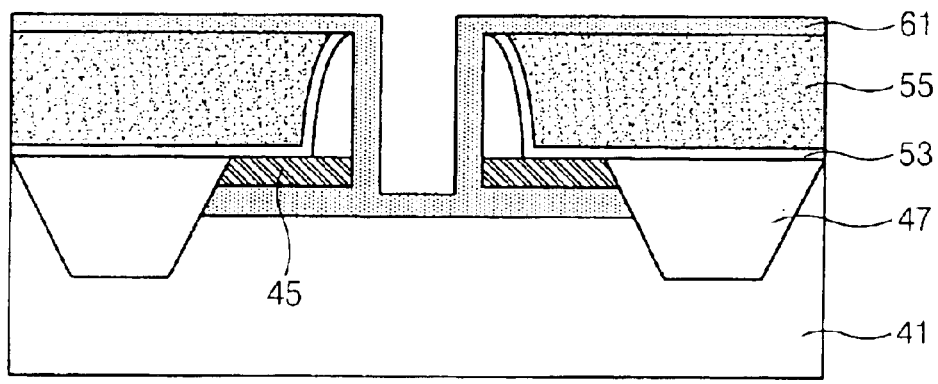

Referring to FIG. 3g, an insulating film 61 for filling the under-cut 59 is formed on the entire surface of the resulting structure. Preferably, the insulating film 61 is an oxide film or a nitride film.

The insulating film 61 is preferably formed via thermal oxidation, chemical vapor deposition (CVD) or atomic layer deposition (ALD).

Preferably, the CVD process is performed using $SiH_4$ and $N_2O$ under a pressure of 50 Torr and at a temperature ranging from 50 to 800° C. The thermal oxidation process is a dry or wet process performed at a temperature ranging from 700 to 1100° C.

Figure 3H:
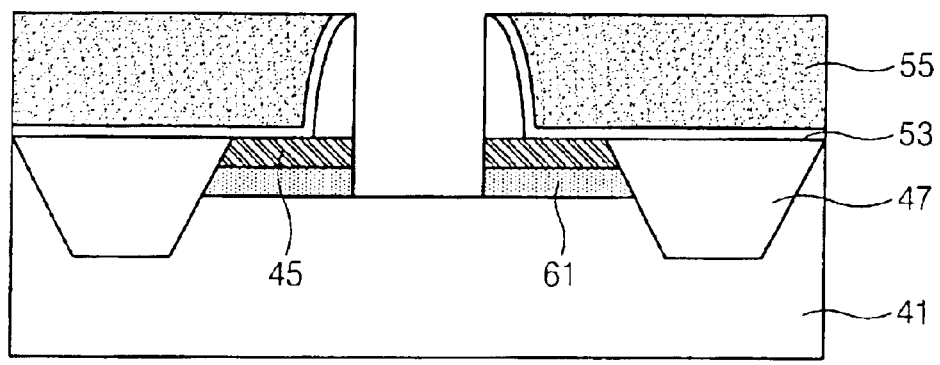

Referring to FIG. 3h, a wet etching process is performed so that only the portion of the insulating film 61 in the under-cut 59 remains. The wet etching process is preferably performed using a HF group etching solution.

Figure 3I:
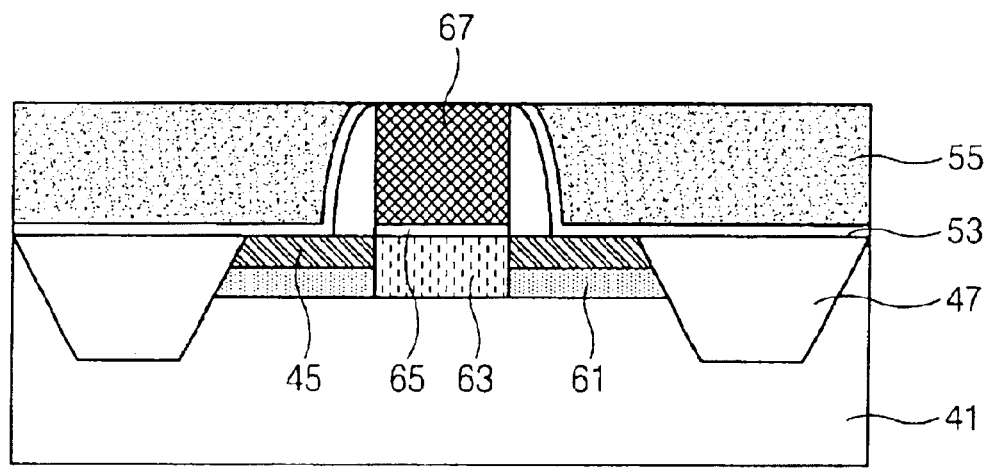

Referring to FIG. 3i, a third epitaxial layer 63, which is preferably an epitaxial Si layer having a thickness ranging from 100 to 2000 Å, is grown on the semiconductor substrate 41 exposed by the gate electrode region 57.

A channel region is formed on the third epitaxial layer 63 by performing a channel implant process and a punch stop implant process.

A gate oxide film 65 is grown on the third epitaxial layer 63, and a conductive layer for gate electrode 67 is formed on the gate oxide film 65, and then planarized using the interlayer insulating film 55 as an etch barrier to form a gate electrode.

The gate electrode may include a stacked structure of a conductive layer and a hard mask layer.

As discussed earlier, in accordance with the present invention, the transistor of the semiconductor device and the method for forming the same have the following advantages:

1. Generation of junction leakage current is prevented.

2. Removal of capacitance generated by junction depletion provides improved operation speed of the device.

3. Improved short channel effects/drain induced barrier lowering characteristics due to the decrease in junction depth provide decrease of a critical dimension of the gate electrode and less threshold voltage reduction.

4. The epitaxial Si layer consisting the source/drain junction region represses depletion in a bulk-wise direction to improve punch-through characteristics and allows a reduction of the dose of punch stop implant to improve refresh characteristics of the DRAM.

5. The improved punch-through characteristics allow reduction of channel threshold voltage control implant dose, thereby improving swing phenomenon and leakage current characteristics in an off state.

6. An increase in junction breakdown voltage allows a high-speed operation of the device which uses a high driving voltage.

7. A remarkable decrease in leakage current between the devices allows reduction of the depth and width of the device isolation film and achievement of high integration.

8. The epitaxial channel region and the source/drain junction region provide an improved interface characteristics of the semiconductor substrate.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a transistor of a semiconductor device, comprising the steps of:
   forming a stacked structure of a first epitaxial layer and a second epitaxial layer on a semiconductor substrate;
   forming a device isolation film of trench type defining an active region, wherein a thickness of the device isolation film is substantially the same as that of the stacked structure;

implanting an impurity into the second epitaxial layer using the device isolation film as a mask;

sequentially forming a thermal oxide film and a sacrificial film on the entire surface of the resulting structure;

etching the sacrificial film, the thermal oxide film, and the second and first epitaxial layers using a gate electrode mask to form an opening exposing the semiconductor substrate;

removing the first epitaxial layer to form an under-cut under the second epitaxial layer;

forming an insulating film filling the under-cut;

growing a third epitaxial layer on the semiconductor substrate exposed by the opening;

removing the sacrificial film and the thermal oxide film;

implanting an impurity into the third epitaxial layer to form a channel region; and forming a gate electrode on the channel region.

2. The method of claim 1, wherein the first epitaxial layer is an epitaxial SiGe layer having a thickness ranging from 50 to 1000 Å which is grown under an atmosphere of a mixture gas of (i) a gas selected from the group consisting of $GeH_4$, $SiH_4$, $SiH_2Cl_2$ and combinations thereof, (ii) HCl and (iii) $H_2$.

3. The method of claim 1, wherein the second epitaxial layer and the third epitaxial layer are epitaxial Si layers having a thickness ranging from 50 to 1000 Å and 100 to 2000 Å, respectively, each of which is grown under an atmosphere of a mixture gas of (i) a gas selected from the group consisting of $SiH_4$, $SiH_2Cl_2$ and combinations thereof, (ii) HCl and (iii) $H_2$.

4. The method of claim 1, wherein the step of implanting an impurity into the second epitaxial layer is performed using As having a concentration ranging from 1.0E12 to 5.0E13 atoms/$cm^2$ with an energy ranging from 10 to 100 KeV.

5. The method of claim 1, wherein the thickness of the thermal oxide film ranges from 10 to 200 Å.

6. The method of claim 1, wherein the sacrificial film is an oxide film, a nitride film or a polysilicon film.

7. The method of claim 1, wherein the step of removing the first epitaxial layer is performed by a wet etching process using a solution containing $H_2O$, $H_2O_2$ and $NH_4OH$ at a temperature ranging from 70 to 80° C.

8. The method of claim 1, wherein the step of removing the first epitaxial layer is performed by an isotropic plasma dry etching process using a mixture gas of HBr, $O_2$ and $Cl_2$.

9. The method of claim 8, wherein the isotropic plasma dry etching process is performed using microwaves or $SF_6$ added to the mixture gas.

10. The method of claim 1, wherein the insulating film is an oxide film or a nitride film.

11. The method of claim 10, wherein the oxide film is formed by a chemical vapor deposition which is performed under a pressure of 50 Torr at a temperature ranging from 50 to 800° C. using $SiH_4$ and $N_2O$ as source gases.

12. The method of claim 10, wherein the oxide film is formed by a dry or a wet thermal oxidation process at a temperature ranging from 700 to 1100° C.

13. The method of claim 1, wherein the insulating film is formed by an atomic layer deposition.

* * * * *